(12) United States Patent  
Fu

(10) Patent No.: US 9,035,649 B2  
(45) Date of Patent: May 19, 2015

(54) 3D MEMS MAGNETOMETER

(71) Applicant: Advanced NuMicro Systems, Inc., San Jose, CA (US)

(72) Inventor: Yee-Chung Fu, Fremont, CA (US)

(73) Assignee: Advanced NuMicro Systems, Inc., San Jose, CA (US)

(*) Notice: Subject to any disclaimer, the term of this patent is extended or adjusted under 35 U.S.C. 154(b) by 267 days.

(21) Appl. No.: 13/844,958

(22) Filed: Mar. 16, 2013

(65) Prior Publication Data

US 2013/0241546 A1  Sep. 19, 2013

Related U.S. Application Data

(60) Provisional application No. 61/612,231, filed on Mar. 16, 2012.

(51) Int. Cl.
  *G01R 33/02* (2006.01)
  *G01R 33/028* (2006.01)

(52) U.S. Cl.
  CPC .......... *G01R 33/02* (2013.01); *G01R 33/0286* (2013.01)

(58) Field of Classification Search
  CPC ......... G01P 15/125; G01P 1/00; G01P 15/00; G01P 11/105; G01P 15/08; G01P 15/14; G01P 15/18; G01R 33/02; G01R 33/0286; G01R 33/0283

USPC ............... 324/244, 252, 256–262; 73/504.04, 73/504.08, 504.11, 504.12; 359/223.1–226.1, 290, 291, 871, 872
See application file for complete search history.

(56) References Cited

U.S. PATENT DOCUMENTS

| | | | |
|---|---|---|---|
| 7,394,245 B2 | 7/2008 | Brunson et al. | |
| 7,466,474 B2 * | 12/2008 | Jung et al. | 359/290 |
| 7,872,394 B1 * | 1/2011 | Gritters et al. | 310/309 |
| 7,969,637 B1 * | 6/2011 | Fu | 359/224.1 |

* cited by examiner

*Primary Examiner* — Tung X Nguyen  
*Assistant Examiner* — Son Le  
(74) *Attorney, Agent, or Firm* — Patent Law Group LLP; David C. Hsia

(57) ABSTRACT

A micro-electromechanical systems (MEMS) magnetometer includes first fixed electrodes, second fixed electrodes, a mobile element to rotate about a first rotation axis along a first direction and translate along a second direction orthogonal to the first direction, mobile electrodes extending from the first mobile element and being interdigitated with the first fixed electrodes to form first sensor assemblies, a rotation element coupled to the mobile element to rotate about a second rotation axis along the second direction, the rotation element having a surface opposite the second fixed electrodes to form second sensor assemblies, the second fixed electrode being displaced from the surface of the rotation element along a third direction, and a trace having sections along the first direction and offset from the first rotation axis and along the second direction and offset from the second rotation axis.

12 Claims, 2 Drawing Sheets

3D MEMS MAGNETOMETER

CROSS REFERENCE TO RELATED APPLICATION

This application claims the benefit of U.S. Provisional Application No. 61/612,231, filed Mar. 16, 2012, which is incorporated herein by reference.

BACKGROUND

U.S. Pat. No. 7,394,245 discloses a resonance magnetometer device.

BRIEF DESCRIPTION OF THE DRAWINGS

In the drawings.

The same reference numbers appearing in different figures indicates similar or identical elements.

DETAILED DESCRIPTION OF THE INVENTION

Figure 1A:
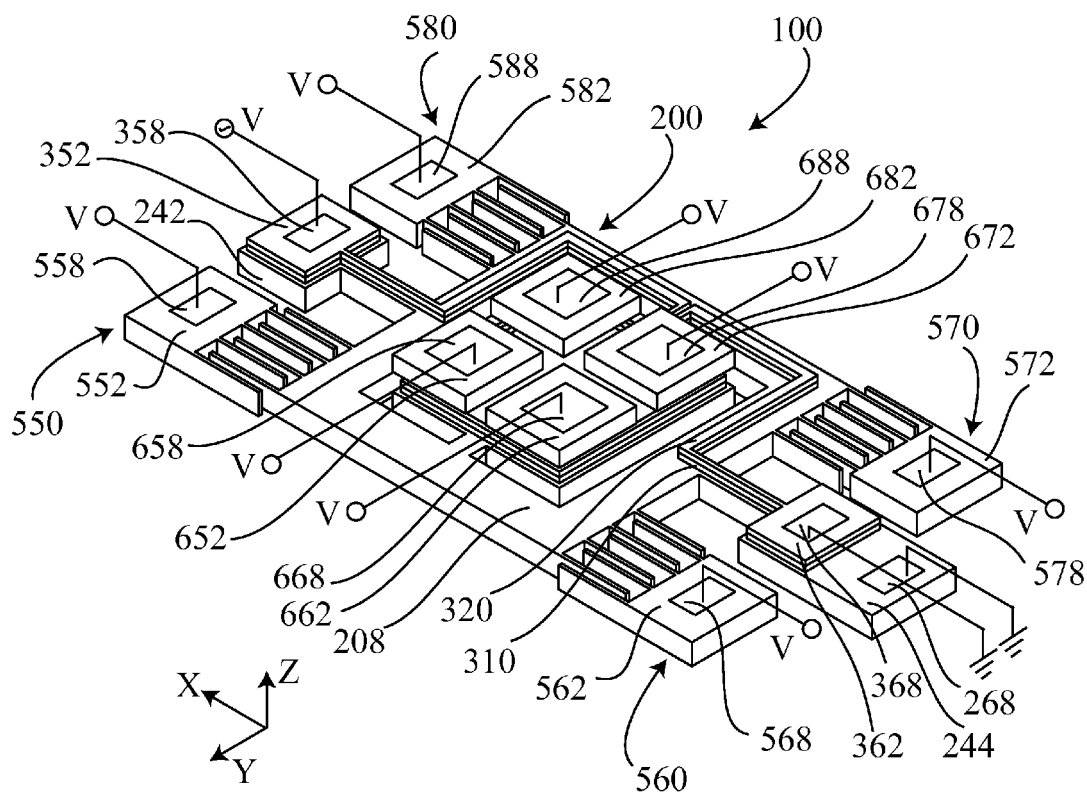
FIG. 1A shows a perspective view of a MEMS magnetometer.

FIG. 1A shows a micro-electromechanical systems (MEMS) magnetometer 100 in one or more embodiments of the present disclosure. The magnetometer 100 includes a movable proof-mass and spring assembly 200, four stationary comb assemblies 550, 560, 570, and 580, four stationary electrode plates 652, 662, 672, and 682, an insulation layer 310, and a trace layer 320. In one embodiment, the proof-mass and spring assembly 200, the four stationary comb assemblies 550, 560, 570, and 580, and the four stationary electrode plates 652, 662, 672, and 682 are made of silicon. In one embodiment, the insulation layer 310 is made of silicon oxide. In one embodiment, the trace layer 320 is made of copper. The movable proof-mass and spring assembly 200 has a top surface 208. The movable proof-mass and spring assembly 200 can rotate about direction X, can move translationally along direction Y, and also rotate about direction Y. The direction X and the direction Y are orthogonal to each other on a surface parallel to the top surface 208 of the movable proof-mass and spring assembly 200. The direction Z is perpendicular to the top surface 208 of the movable proof-mass and spring assembly 200. The four stationary comb assemblies 550, 560, 570, and 580 are Y-directional sensing comb assemblies.

The trace layer 320 includes a first end 352 and a second end 362. Two pads 358 and 368 are deposited on the two ends 352 and 562 of the trace layer 320. The pad 358 is hot. The pad 368 connects to ground. An alternating current flows from the pad 358 through the trace layer 320 to the pad 368. The four stationary comb assemblies 550, 560, 570, and 580 have four anchors 552, 562, 572, and 582 mounted to a device wafer. Four pads 558, 568, 578, and 588 are deposited on the four anchors 552, 562, 572, and 582 of the four stationary comb assemblies 550, 560, 570, and 580. Four pads 658 668, 678, and 688 are deposited on the four stationary electrode plates 652, 662, 672, and 682. The eight pads 558, 568, 578, 588, 658, 668, 678 and 688 are hot. The movable proof-mass and spring assembly 200 has two anchors 242 and 244 mounted to the device wafer. One pad 268 is deposited on the anchor 244 of the movable proof-mass and spring assembly 200. The pad 268 connects to ground. In one embodiment, the eleven pads 268, 358, 368, 558, 568, 578, 588, 658, 668, 678, and 688 are made of aluminum copper (AlCu). In another embodiment, the eleven pads 268, 358, 368, 558, 568, 578, 588, 658, 668, 678, and 688 are further plated with nickel (Ni).

Figure 1B:
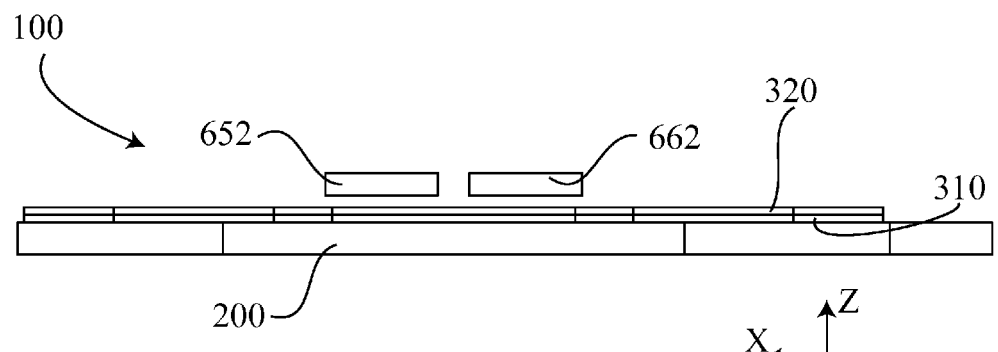
FIG. 1B shows a side view of the MEMS magnetometer of FIG. 1A.

FIG. 1B shows the two stationary electrode plates 652 and 662 are vertically displaced from the movable proof-mass and spring assembly 200. Electrode plates 652, 662, 672, and 682 and the top surface of the proof-mass 282 from first sensor assemblies. The fixed electrodes 652 and 662 are more sensitive to a clockwise rotation of the proof-mass 282 about the X direction because in the clockwise rotation reduces the gap to the top surface of proof-mass 282. The fixed electrodes 672 and 682 are more sensitive to a counterclockwise rotation of the proof-mass 282 about the X direction because in the counterclockwise rotation reduces the gap to the top surface of proof-mass 282. The fixed electrodes 652 and 682 are more sensitive to a counterclockwise rotation of the proof-mass 282 about the Y direction because in the counterclockwise rotation reduces the gap to the top surface of proof-mass 282. The fixed electrodes 662 and 672 are more sensitive to a clockwise rotation of the proof-mass 282 about the Y direction because in the clockwise rotation reduces the gap to the top surface of proof-mass 282.

The insulation layer 310 is on top of the movable proof-mass and spring assembly 200. The trace layer 320 is on top of the insulation layer 310. Although not shown, there is a cover wafer bonded on the top surface of the device wafer on which the proof-mass and spring assembly 200 and four stationary comb assemblies 550, 560, 570, and 580 are mounted. This cover wafer may be made of either silicon or glass. Metal may be deposited on the surface of the cover wafer facing the proof-mass 282 to form the stationary electrode plates 652, 662, 672, and 682. The electrode plates 652, 662, 672, and 682 are arranged in a rectangular grid pattern.

Figure 2:
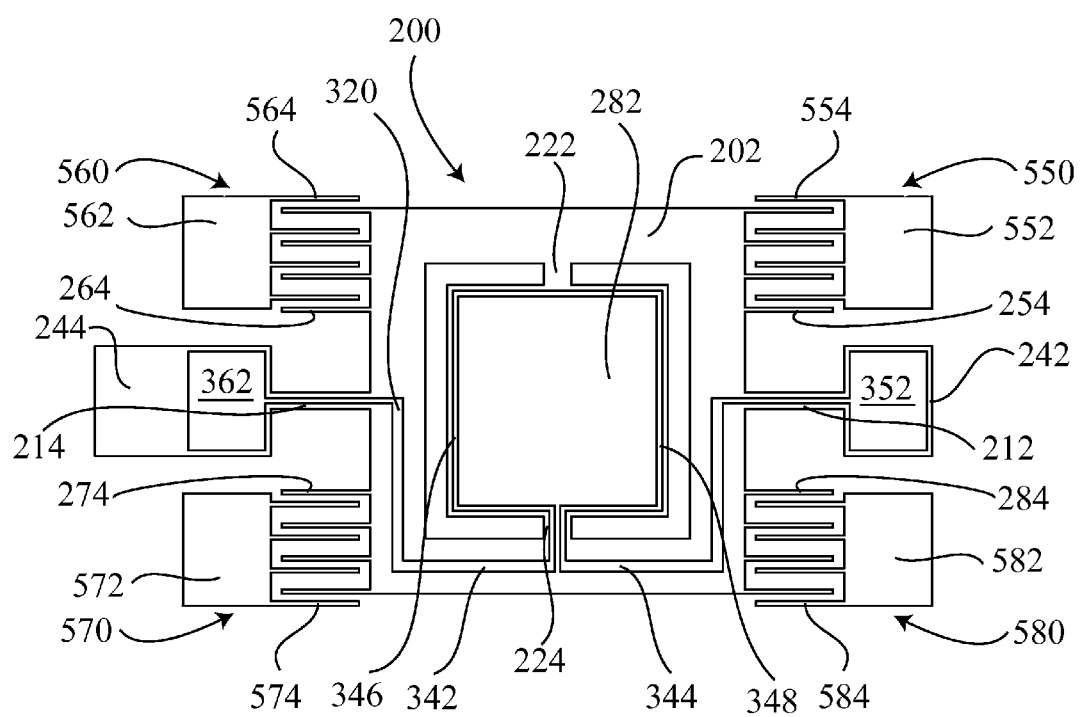
FIG. 2 shows a top view of a movable proof-mass and spring assembly and four stationary Y-directional sensing comb assemblies, all arranged according to embodiments of the present disclosure.

FIG. 2 shows a top view of the movable proof-mass and spring assembly 200, the four stationary Y-directional sensing comb assemblies 550, 560, 570, and 580, and the trace layer 320. In one embodiment, the movable proof-mass and spring assembly 200 has two Y-directional springs 212 and 214, two rotational or torsional springs 222 and 224, one frame 202, one proof-mass 282, four Y-directional sensing comb sets 254, 264, 274, and 284. The two Y-directional springs 212 and 214 have lower stiffness in the Y-direction than those in the X-direction and in the Z-direction. The two Y-directional springs 212 and 214 also have low rotational stiffness about X-direction. The two Y-directional springs 212 and 214 connect the frame 202 to the two anchors 242 and 244 so the frame 202 is able to translate along the Y-direction and rotate about the X-direction. The two rotational springs 222 and 224 connect the proof-mass 282 to the frame 202 so the proof-mass 282 is able to rotate about the Y-direction. The four Y-directional sensing comb sets 254, 264, 274, and 284 extend out horizontally from the frame 202.

The trace layer 320 includes a first X-direction section 342 and a second X-direction section 344. The first X-direction section 342 and the second X-direction section 344 of the trace layer 320 are formed above the frame 202 of the movable proof-mass and spring assembly 200. The first X-direction section 342 and the second X-direction section 344 of the trace layer 320 are displaced from the springs 212 and 214 in the Y-direction. The trace layer 320 further includes a first Y-direction section 346 and a second Y-direction section 348. The first Y-direction section 346 and the second Y-direction section 348 of the trace layer 320 are formed above the proof-mass 282 of the movable proof-mass and spring assembly 200. The first Y-direction section 346 and the second Y-direction section 348 of the trace layer 320 are displaced from the springs 222 and 224 in the X-direction.

The four stationary Y-directional sensing comb assemblies 550, 560, 570, and 580 have four Y-directional sensing comb sets 554, 564, 574, and 584 extending longitudinally from the four anchors 552, 562, 572, and 582. Each Y-directional sensing comb set may consist of parallel electrode plates, also known as "fingers." The four Y-directional sensing comb sets 554, 564, 574, and 584 of the four Y-directional sensing comb assemblies 550, 560, 570, and 580 interdigitize with the four Y-directional sensing comb sets 254, 264, 274, and 284 of the movable proof-mass and spring assembly 200, respectively, to form second sensor assemblies. Instead of two interdigitated comb sets being evenly spaced, the two interdigitated comb sets are offset in either a positive or negative Y direction.

In one embodiment, the fingers in a pair of interdigitated Y-directional sensing comb sets are offset in either the positive or the negative Y direction. The fingers are offset in the positive Y direction when the space between a mobile finger and its neighboring fixed finger (if any) in the positive Y direction is smaller than the space between the mobile finger and its fixed neighbor (if any) in the negative Y positive direction, which makes that pair of interdigitated pair of Y-directional sensing comb sets more sensitive to translation along the positive Y direction. Conversely the fingers are offset in the negative Y direction when the space between a mobile finger and its fixed neighbor (if any) in the negative Y direction is smaller than the space between the mobile finger and its fixed neighbor (if any) in the positive Y positive direction, which makes that pair of interdigitated pair of Y-directional sensing comb sets more sensitive to translation along the negative Y direction. In one embodiment, the pair of the Y-directional sensing comb sets 254 and 554 are offset in the positive Y direction, the pair of the Y-directional sensing comb sets 264 and 564 are offset in the positive Y direction, the pair of the Y-directional sensing comb sets 274 and 574 are offset in the negative Y direction, and the pair of the Y-directional sensing comb sets 284 and 584 are offset in the negative Y direction.

The alternating current flows from the pad 358 through the trace layer 320 to the pad 368 has three frequency components matching the Y-translation, X-rotation, and Y-rotation resonance frequencies of the movable proof-mass and spring assembly 200.

When the magnetometer 100 experiences a magnetic field in the X-direction, two Lorentz forces in opposite Z-directions are generated on the first Y-direction section 346 and the second Y-direction section 348 of the trace layer 320. The proof-mass 282 rotates about the springs 222 and 224. The magnitude of the magnetic field in the X-direction can be calculated from the change of the capacitance between proof-mass 282 and the four stationary electrode plates 652, 662, 672, and 682.

When the magnetometer 100 experiences a magnetic field in the Y-direction, two Lorentz forces in the same Z-direction are generated on the first X-direction section 342 and the second X-direction section 344 of the trace layer 320. The frame 202, the springs 222 and 224, and the proof-mass 282 rotates about the springs 212 and 214. The magnitude of the magnetic field in the Y-direction can be calculated from the change of the capacitance between proof-mass 282 and the four stationary electrode plates 652, 662, 672, and 682.

When the magnetometer 100 experiences a magnetic field in the Z-direction, two Lorentz forces in the same Y-direction are generated on the first X-direction section 342 and the second X-direction section 344 of the trace layer 320. The frame 202, the springs 222 and 224, and the proof-mass 282 moves along the Y-direction. The magnitude of the magnetic field in the Z-direction can be calculated from the change of the capacitance between the four Y-directional sensing comb sets 554, 564, 574, and 584 of the four Y-directional sensing comb assemblies 550, 560, 570, and 580 and the four Y-directional sensing comb sets 254, 264, 274, and 284 of the movable proof-mass and spring assembly 200.

The vector sum of the magnetic field can be obtained after each of the three magnetic field components in the X, Y, Z directions have been calculated.

A driver circuit drives the trace 320. The changes in capacitance are detected by sensing circuits coupled to the sensing comb assemblies 550, 560, 570, and 580, and electrode plates 652, 662, 672, and 682. The driver circuit and the sensing circuit may be located on chip or off chip. A controller may be connected to the capacitance circuits to determine capacitance changes and determine the magnitudes of the translational acceleration and rotational speed from the capacitance changes. The controller may be located on chip or off chip.

Various other adaptations of the embodiments disclosed are within the scope of the invention. For instance, using one Y-directional sensing comb set instead of using four Y-directional sensing comb sets. For instance, using one Y-directional spring instead of using two Y-directional springs. For instance, using serpentine springs instead of using linear springs. For instance, using different trace layout yet still with at least one X-direction section above the frame and at least one Y-direction section above the proof-mass.

The invention claimed is:

1. A micro-electromechanical systems (MEMS) magnetometer, comprising:
   first fixed electrodes;
   second fixed electrodes;
   a mobile element to rotate about a first rotation axis along a first direction and translate along a second direction orthogonal to the first direction;
   mobile electrodes extending from the mobile element and being interdigitated with the first fixed electrodes to form one or more first sensor assemblies;
   a rotation element to rotate about a second rotation axis along the second direction, the rotation element having a surface opposite the second fixed electrodes to form one or more second sensor assemblies, the second fixed electrode being displaced from the surface of the rotation element along a third direction orthogonal to the first and the second directions; and
   a trace on but insulated from the mobile element and the rotation element, the trace comprising:
      one or more first sections along the first direction and offset from the first rotation axis; and
      one or more second sections along the second direction and offset from the second rotation axis.

2. The magnetometer of claim 1, further comprising:
   one or more sensing circuits coupled to the one or more first sensor assemblies and the one or more second sensor assemblies; and
   a controller coupled to the one or more sensing circuits to determine magnitudes of a magnetic field in the first direction, the second direction, and the third direction and to determine a vector sum of the magnetic field from the magnitudes.

3. The magnetometer of claim 1, wherein:
the magnetometer further comprises one or more fixed anchors, one or more first springs, and one or more second springs;
the mobile element comprises a frame coupled by the one or more first springs to the one or more fixed anchors; and
the rotation element comprises a proof-mass coupled by the one or more second springs to the frame.

4. The magnetometer of claim 3, wherein:
the one or more first springs have lower stiffness in the second direction than in the first and the third directions, and low rotation stiffness about the first direction; and
the one or more second springs have low rotation stiffness about the second direction.

5. The magnetometer of claim 3, wherein spacing of fixed and mobile electrodes in each of the first and the second sensor assemblies is offset in a positive or a negative direction so the sensor assembly is more sensitive in the positive or the negative direction.

6. The magnetometer of claim 3, wherein the second fixed electrodes comprise four electrode plates arranged in a rectangular grid pattern so pairs of electrode plates are more sensitive in a positive or a negative direction of a rotation about the first or the second directions than other pairs of electrode plates.

7. The magnetometer of claim 3, further comprising a driving circuit to supply an alternating current having frequencies matching resonance frequencies of a proof mass and spring assembly translating in the second direction, rotating about first direction, and rotating about the second direction, the proof-mass and spring assembly comprising the frame and the proof mass.

8. The magnetometer of claim 7, further comprising:
one or more sensing circuits coupled to the one or more first sensor assemblies and the one or more second sensor assemblies; and
a controller coupled to the one or more sensing circuits, wherein the controller is configured to:
determine a first capacitance change of the one or more second sensor assemblies corresponding to a first rotation about the second direction;
determine a first magnitude of a magnetic field in the first direction from the first capacitance change;
determine a second capacitance change of the one or more second sensor assemblies corresponding to a second rotation about the first direction;
determine a second magnitude of the magnetic field in the second direction from the second capacitance change;
determine a third capacitance of the one or more first sensor assemblies corresponding to a displacement along the second direction; and
determine a third magnitude of the magnetic field in the third direction from the third capacitance change.

9. The magnetometer of claim 8, wherein the controller is further configured to determine a vector sum of the magnetic field from the first, the second, and the third magnitudes.

10. A method for a magnetometer, comprising:
determining a first capacitance change resulting from a first rotation of a proof-mass about a second direction;
determining a first magnitude of a magnetic field in a first direction, which is orthogonal to the second direction, from the first capacitance change;
determining a second capacitance change resulting from a second rotation of a proof-mass and spring assembly about the first direction, the proof-mass and spring assembly including a frame and the proof-mass coupled to the frame;
determining a second magnitude of the magnetic field in the second direction from the second capacitance change;
determining a third capacitance change resulting from a translation of the proof-mass and spring assembly along the second direction; and
determining a third magnitude of the magnetic field in the third direction from the third capacitance change, the third direction being orthogonal to the first and the second directions.

11. The method of claim 10, further comprising determining vector sum of the magnetic field from the first, the second, and the third magnitudes.

12. The method of claim 10, further comprising passing an alternating current through a trace on the frame and the proof-mass.

* * * * *